(12) United States Patent
Tung et al.

(10) Patent No.: US 7,203,923 B2
(45) Date of Patent: Apr. 10, 2007

(54) CAPACITORS INTEGRATED WITH INDUCTIVE COMPONENTS

(76) Inventors: John C. Tung, 20975 Valley Green Dr., Suite 293, Cupertino, CA (US) 95014; Minghao (Mary) Zhang, 20975 Valley Green Dr., Suite 293, Cupertino, CA (US) 95014

( * ) Notice: Subject to any disclaimer, the term of this patent is extended or adjusted under 35 U.S.C. 154(b) by 464 days.

(21) Appl. No.: 10/894,521

(22) Filed: Jul. 19, 2004

(65) Prior Publication Data
US 2006/0012006 A1 Jan. 19, 2006

(51) Int. Cl.
*G06F 17/50* (2006.01)
(52) U.S. Cl. ............................... 716/19; 716/1; 716/10
(58) Field of Classification Search .................. 716/1, 716/10, 19, 20, 21
See application file for complete search history.

(56) References Cited

U.S. PATENT DOCUMENTS

2003/0200509 A1* 10/2003 Takabayashi et al. .......... 716/1

* cited by examiner

*Primary Examiner*—Thuan Do
(74) *Attorney, Agent, or Firm*—Joe Zheng (57) ABSTRACT

Techniques for producing integrated capacitors are disclosed. According to one of the techniques, one or more layers are introduced in conjunction with a ground layer supporting a substrate on which various components are realized. Depending on the use of an integrated capacitor, micro capacitors can be formed between one introduced layer and the ground layer or between two introduced layers. As all micro capacitors are connected in parallel, an integrated capacitor with usable capacitance is thus produced without occupying an extra space that would otherwise increase the size of the silicon chip. In addition, with proper connections, an interdigitated capacitor can be formed as well.

19 Claims, 11 Drawing Sheets

CAPACITORS INTEGRATED WITH INDUCTIVE COMPONENTS

BACKGROUND OF THE INVENTION

1. Field of the Invention

The invention is generally related to the area of integrated circuits designs. More particularly, the invention is related to designs of one or more capacitors in integrated circuits without requiring additional spaces, wherein the capacitors are integrated with inductive components (e.g. inductors or transformers) and without affecting the inductive components.

2. The Background of Related Art

An integrated circuit (IC), sometimes called a chip or microchip, is a piece of semiconductor wafer on which thousands or millions of tiny components, such as resistors, capacitors, and transistors, are fabricated. An IC can function as an amplifier, oscillator, timer, counter, computer memory, or microprocessor.

A capacitor is a passive electronic component that stores energy in the form of an electrostatic field while an inductor is a passive electronic component that stores energy in the form of a magnetic field. In its simplest form, a capacitor consists of two conducting plates separated by an insulating material called the dielectric and an inductor consists of a wire loop or coil. Capacitance is directly proportional to the surface areas of the plates, and is inversely proportional to the separation between the plates. Capacitance also depends on the dielectric constant of the substance separating the plates. Inductance is directly proportional to the number of turns in the coil. Inductance also depends on the radius of the coil, the space between the turns, thickness of the material of the coil, and on the type of material around which the coil is wound. For a given coil radius and number of turns, dielectric materials such as wood, glass, and plastic result in the least inductance while ferromagnetic substances such as iron, laminated iron, and powdered iron increase the inductance. The shape of the core as well as the wire or coil can also be significant. The standard unit of capacitance is the farad, abbreviated F. Farad (F) is a large unit; more common units are the microfarad, abbreviated $\mu F$ (1 $\mu F = 10^{-6}$ F) and the picofarad, abbreviated pF (1 pF=$10^{-12}$ F). The standard unit of inductance is the henry, abbreviated H. Henry (H) is a large unit. More common units are the microhenry, abbreviated $\mu H$ (1 $\mu H = 10^{-6}$ H) and the millihenry, abbreviated mH (1 mH=$10^{-3}$ H). Occasionally, the nanohenry (nH) is used (1 nH=$10^{-9}$ H). As signal frequency goes high, for example, in gigahertz range, inductors with the picohenry (pH) are often used (1 pH=$10^{-12}$ H).

Figure 1:
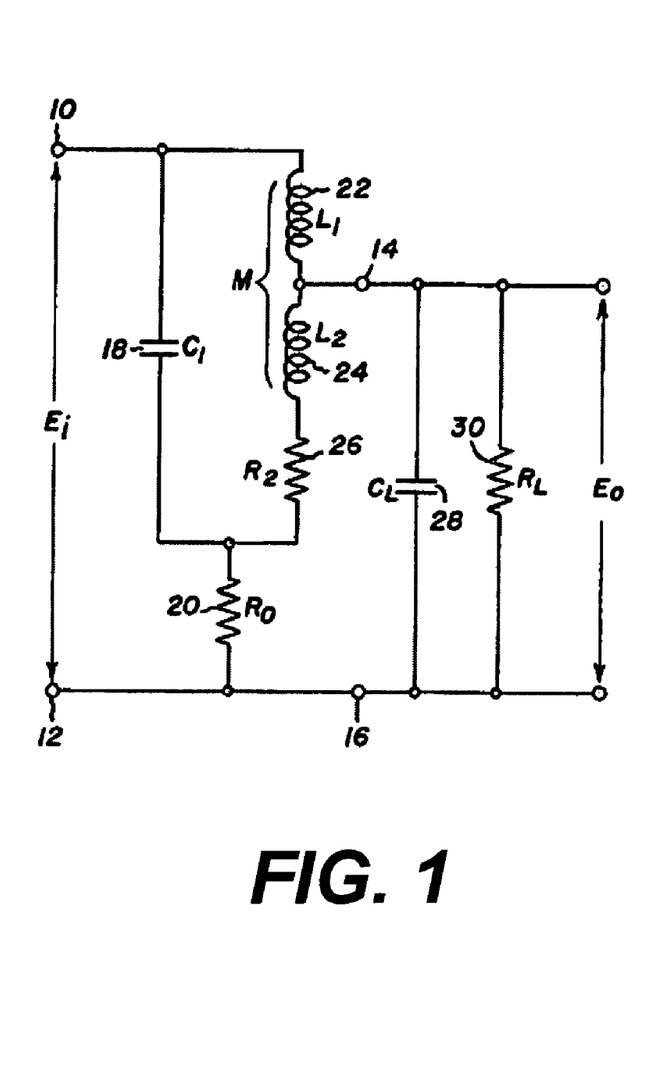
FIG. 1 shows a capacitor $C_I$ connected across two inductors L1 and L2, and a resistor R2.

Capacitors can be fabricated onto integrated circuit (IC) chips. They are commonly used in conjunction with transistors in dynamic random access memory (DRAM). The capacitors help maintain the contents of memory. Capacitors are sometimes used with inductors or transformers in various applications such as wireless or high speed data communications. A capacitor connected in series or parallel with one or more inductors can provide discrimination against unwanted signals. FIG. 1 shows a circuit 100 preferably implemented in an integrated circuit and is used for a bridged-T termination network providing constant input impedance with a capacitive load. The circuit 100 includes two capacitors, two inductors and three resistors, each with different values, to achieve characteristic impedance over a wide frequency range even when feeding into a capacitive load.

Figure 2:
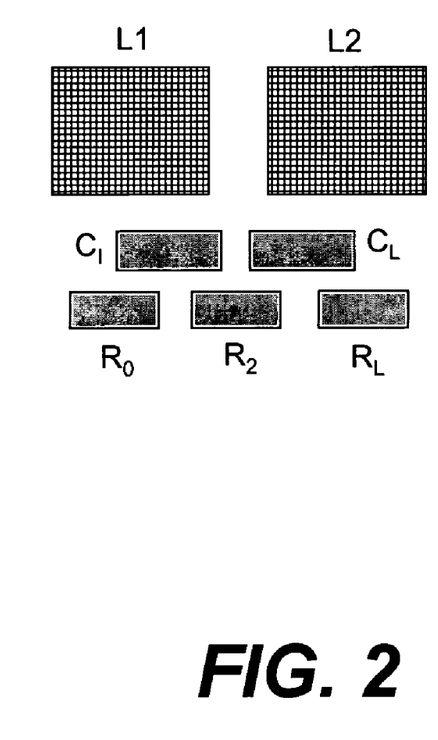
FIG. 2 shows a possible layout (not scaled) of an implementation of the circuit of FIG. 1.

The traditional approach to implement capacitors that are designed to work in conjunction with inductors is to implant pairs of conducting plates in a semiconductor material. The size of the plates depends on the required capacitance. FIG. 2 shows a possible layout (not scaled) of an implementation of the circuit 100. As shown, each of the components (two capacitors, two inductors and three resistors) is implemented. Because of the possible interference from the inductors, there are some requirements about the implementation of the inductors in presence of other components. One of the requirements (e.g., in the process of Low Temperature Cofired Ceramic or LTCC technology) is that no other components shall be within a certain range of the inductors, resulting in occupation of more silicon space. However, in many circuit designs, especially, high-speed circuits, capacitors are often used in conjunction with inductors. The traditional approaches, as one shown in FIG. 2, would take a significant space in a silicon chip to implement capacitors with usable capacitance.

Figure 3:
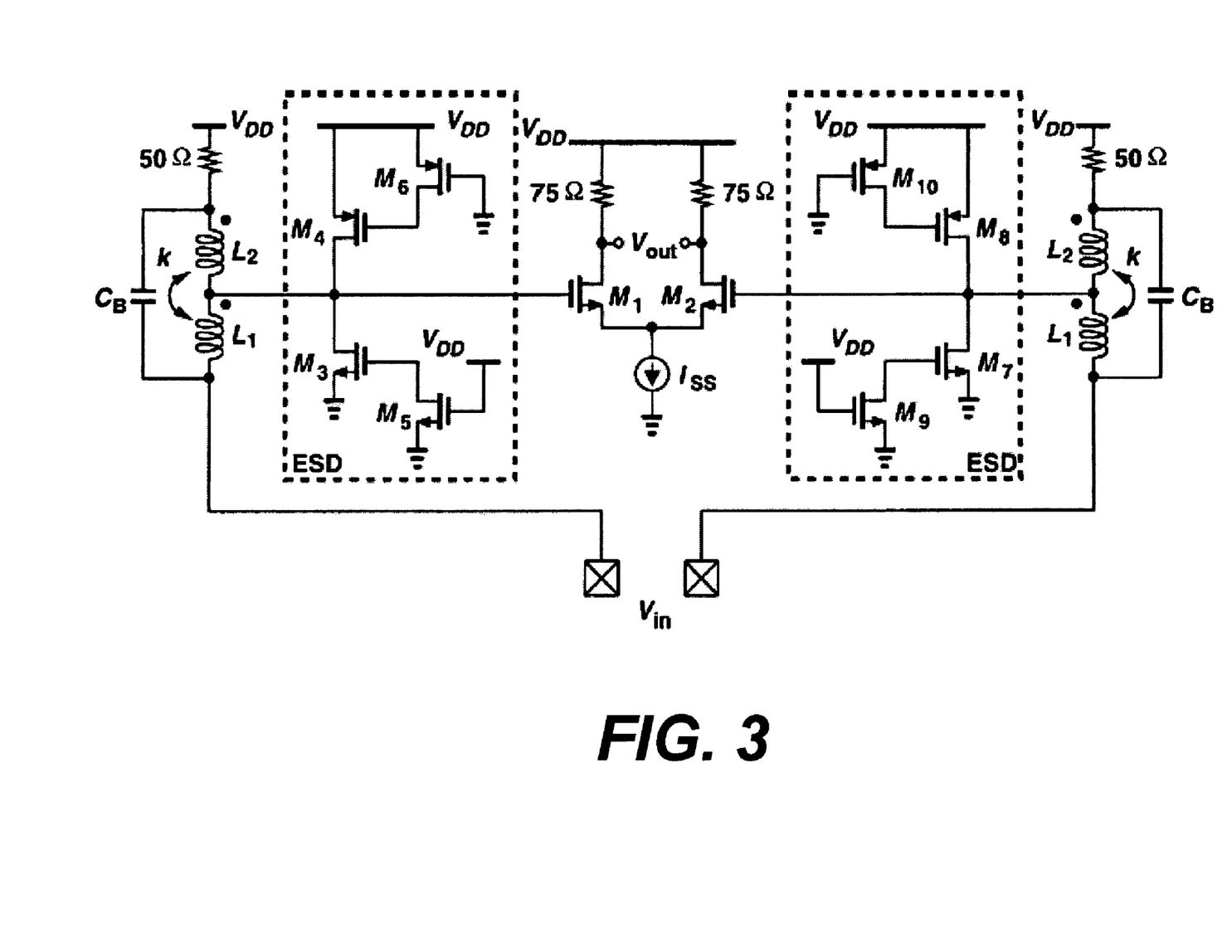
FIG. 3 shows a capacitor $C_B$ connected across two inductors L1 and L2.

FIG. 3 duplicates FIG. 6 of Galal et al, "Broadband ESD Protection Circuits in CMOS Technology", IEEE Journal of Solid-State Circuits, Vol. 38, No. 12, December 2003, pp. 2334–2340, which is hereby incorporated by reference. FIG. 3 shows an input electrostatic discharge protection circuit that involves more capacitors and inductors used together. When a chip includes a large number of inductors and capacitors, especially with varying capacitance, the cost of the chip can be a factor of the number of the inductors and the capacitors or the total area of the conducting stripes for the inductors and capacitors.

There is thus a tremendous need for solutions of implementing on-chip capacitors in conjunction with inductors or transformers without taking up too much wafer space and, at the same time, without compromising functions or performance of the inductors or transformers. The present invention provides designs of capacitors integrated with inductors or transformers and does not take up additional spaces in a silicon wafer and affects inductance of the inductors or transformers thereon.

SUMMARY OF THE INVENTION

This section as well as the abstract of the present invention is for the purpose of summarizing some aspects of the present invention and to briefly introduce one or more preferred embodiments. Simplifications or omissions may be made to avoid obscuring the purpose of the section and the abstract. Such simplifications or omissions are not intended or should not be interpreted to limit the scope of the present invention.

The present invention pertains to techniques for forming capacitors or interdigitated capacitors integrated with inductors or transformers. The techniques as described herein can be implemented as apparatus and methods for making the same. The capacitors contemplated by the present invention have been proved to be effective in high speed signal processing circuits. One of the key features in the present invention is that these capacitors do not take extra spaces in a silicon chip on which various other components such as transistors, resistors or inductors are formed. According to one aspect of the present invention, capacitors are implemented in one or more layers vertically above and/or below inductors or transformers without interfering or being interfered from the inductors or transformers.

According to one embodiment of the present invention, a first (additional) layer is implanted below a ground layer supporting a substrate on which various components are realized. In one situation in which one or more inductors are realized on layers above the substrate, thus the ground layer includes a plurality of conducting stripes arranged in accordance with a predetermined pattern to shield possible interference from the substrate and/or the inductors. The first layer is configured to include a plurality of conducting stripes arranged in accordance with the predetermined pattern. When the first layer and the ground layer are positioned on top of each other, a plurality of micro capacitors are respectively formed by the pairs of the conducting stripes on the first layer and the ground layer. These micro capacitors are connected in parallel to thus produce an integrated capacitor with usable capacitance. A dielectric layer may be inserted between the first layer and the ground layer to increase the capacitance of the resultant capacitor.

According to another embodiment of the present invention, a second layer, preferably identical to a first layer, is introduced. Both layers include conducting stripes arranged according to a predetermined pattern. When the first and second layers are on top of each other, a plurality of micro capacitors are respectively formed by the pairs of the conducting stripes on the first and second layers. These micro capacitors are connected in parallel to thus produce an integrated capacitor with usable capacitance.

When the ground layer is used for the micro capacitors, one of the terminals of the resultant capacitor is grounded. Such capacitors are commonly used in filtering applications. According to still another embodiment of the present invention, these micro capacitors are formed between the introduced layers as such the resultant capacitors do not have a ground terminal. Such capacitors are commonly used in coupling applications.

According to yet still another embodiment of the present invention, the conducting stripes interlaced on the first layer and the second layer are respectively arranged in accordance with an identical pattern to form two sets of micro interdigitated capacitors. When the first layer and the second layer and connected by arrays of conducting walls or stripes, these micro interdigitated capacitors are connected in parallel to produce an interdigitated capacitor with usable capacitance and perhaps desired inductance.

There are many benefits, advantages and features in the present invention. One of the key features, advantages and objects of the present invention is to realize an integrated capacitor or an interdigitated capacitor with inductive components in an integrated circuit without taking up an additional space in a silicon chip.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE PREFERRED EMBODIMENT

The present invention pertains to realizing a capacitor with an inductive component in integrated circuits. According to one aspect of the present invention, one or more layers are introduced in conjunction with a ground layer supporting a substrate on which various components are realized. Depending on the use of the capacitor, a plurality of micro capacitors can be formed between one introduced layer and the ground layer or between two introduced layers. As all micro capacitors are connected in parallel, a capacitor with usable capacitance is thus produced without increasing the size of the silicon (chip) allocated for an integrated circuit. In addition, with proper connections, an interdigitated capacitor can be formed as well. These capacitors have been proved to be effective in high speed signal processing circuits.

The detailed description of the present invention is presented largely in terms of procedures, steps, logic blocks, processing, or other symbolic representations that directly or indirectly resemble the operations of electronic circuits or systems that process signals for desired outputs. These process descriptions and representations are typically used by those skilled in the art to most effectively convey the substance of their work to others skilled in the art. Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

Embodiments of the invention are discussed herein with reference to FIGS. 1–7 in which like numerals refer to like parts throughout the several views. However, those skilled in the art will readily appreciate that the detailed description given herein with respect to these figures is for explanatory purposes as the invention extends beyond these limited embodiments Capacitors can be found in many circuits used together with inductive components. When integrated in silicon, capacitors can provide useful performance characteristics, especially in processing high speed signals. One of a typical design in high speed signal circuits, as seen from both FIG. 1 and FIG. 3, is to have one or more capacitors across inductors. FIG. 1 shows a capacitor $C_I$ connected across two inductors L1 and L2, and a resistor R2. FIG. 3 shows a capacitor $C_B$ connected across two inductors L1 and L2. If these components are implemented as designed shown in FIG. 2, some spaces in the silicon will be occupied by the capacitors. If there are a large number of such capacitors, the spaces can be significant, resulting in a larger silicon size and hence higher cost of the resultant chips. According to one aspect of the present invention, the spaces that would be otherwise occupied by the capacitors are no longer needed without diminishing the capacitors. In other words, the capacitors are integrated with inductors and thus the spaces are saved, resulting in a smaller chip and hence a lower cost of the chip.

Figure 4A:
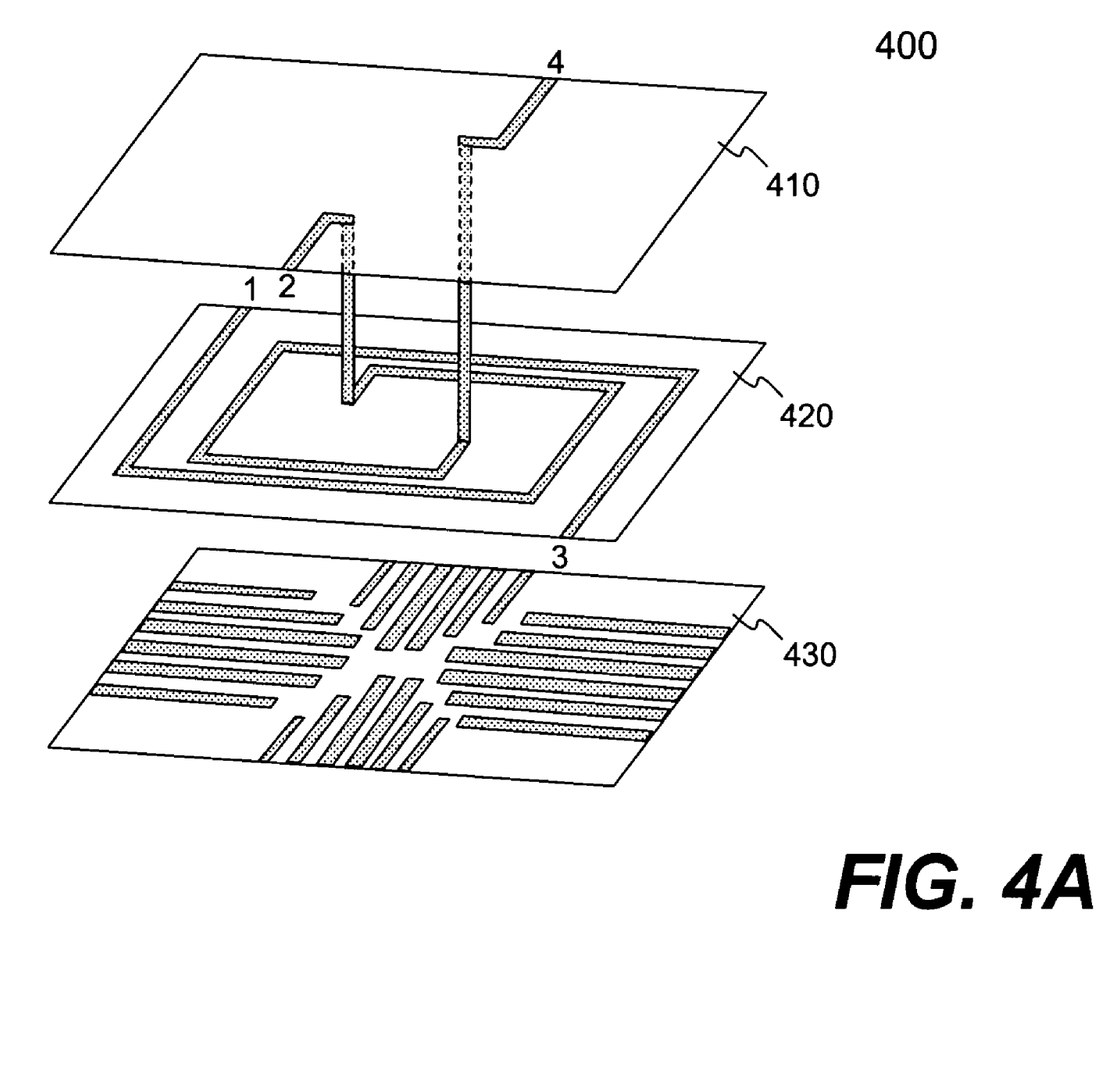
FIG. 4A shows an exemplary implementation of a transformer or two inductors L1 and L2, where the inductor L1 is formed by a conducting stripe 1–2 and the inductor L2 is formed by a conducting stripe 3–4, a patterned ground is provided to isolate the transformer from the substrate and/or other components.

FIG. 4A shows an exemplary implementation of a transformer or two inductors L1 and L2, where the inductor L1 is formed by a conducting stripe 1–2 and the inductor L2 is formed by a conducting stripe 3–4. The conducting stripes, also referred to as microstripe and therefore sometimes referred to as monolithic implementation, are wounded on a layer 420 according to a predetermined pattern. The layer 410 is an optional layer for providing connections to other components. A patterned ground layer 430 including substantially arrays of conducting stripes or fingers formed in accordance with a predetermined pattern that contains holes, gaps, or slots to shield possible interference from the substrate and the inductors.

Figure 4B:
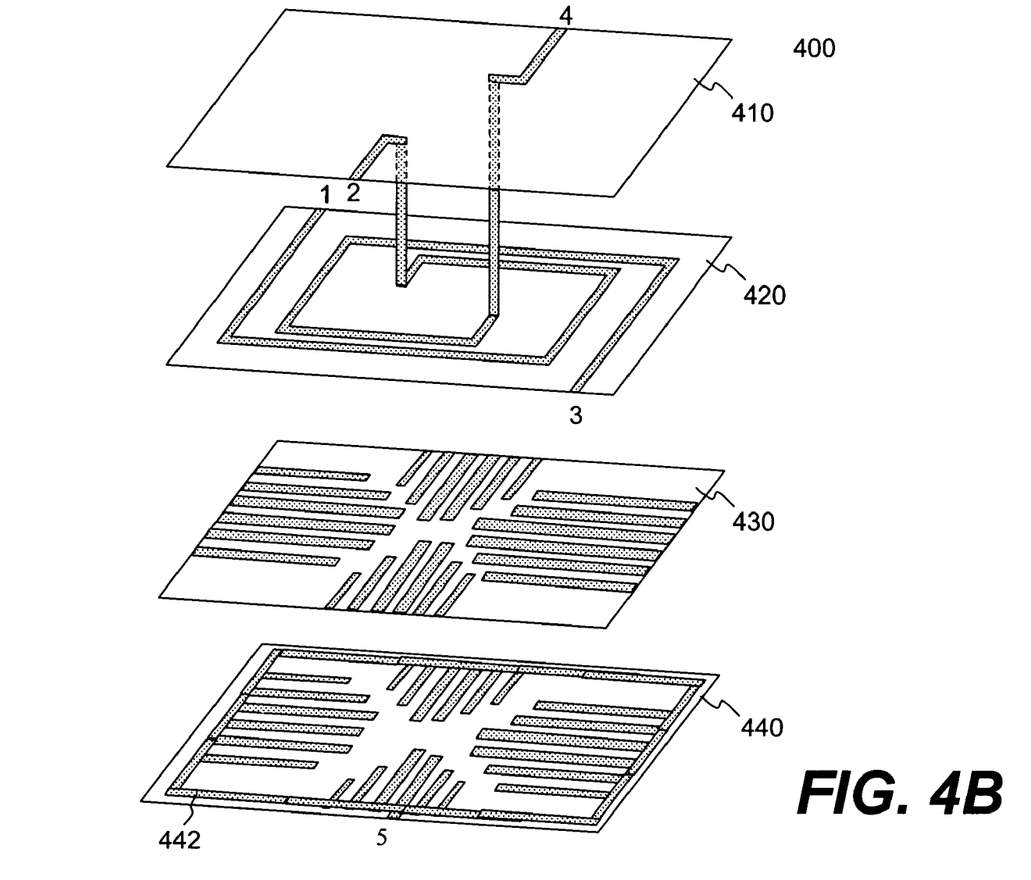
FIG. 4B shows an implementation of a capacitor in accordance with one embodiment of the present invention.

FIG. 4B shows an implementation of a capacitor in accordance with one embodiment of the present invention. In reference to FIG. 4A, a layer 440 is added. The layer 440 includes conducting stripes formed in accordance with a pattern substantially similar to that on the layer 430. In order words, both layers 430 and 440 have conducting stripes respectively formed in a predetermined pattern. In principle, the conducting stripes on both layers 430 and 440 are positioned on top of each other, as a result, each pair of the conducting stripes on both layers 430 and 440 forms a small or micro capacitor. As all the micro capacitors are connected in parallel, the capacitance of the resultant capacitor accumulates the capacitances from all the micro capacitors and thus becomes usable.

Figure 4C:
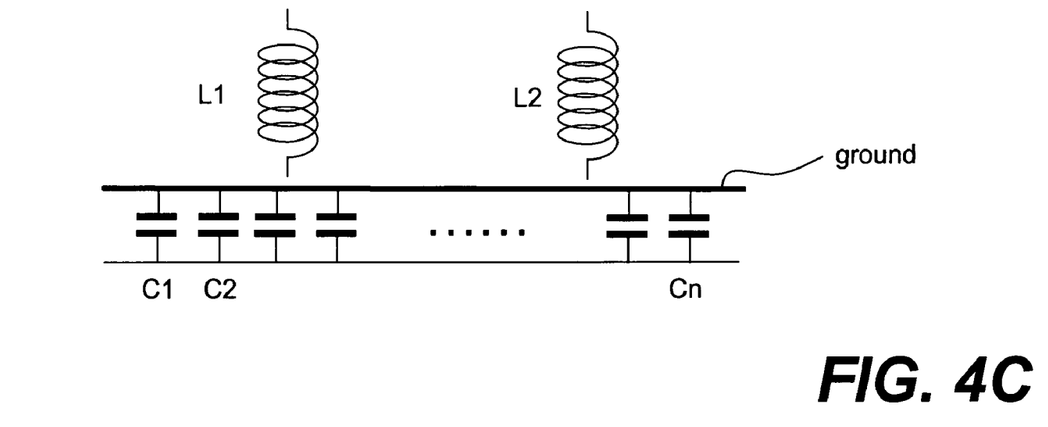
FIG. 4C shows an equivalent circuit of FIG. 4B.
Figure 4D:
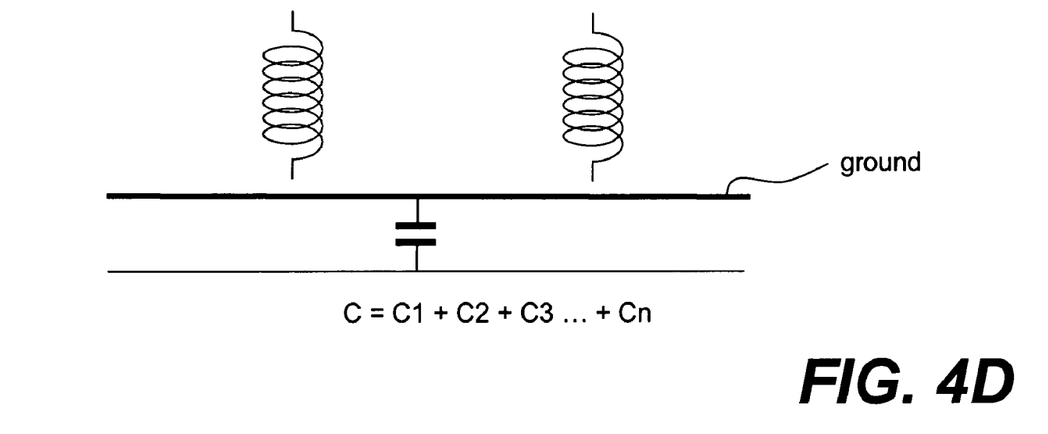
FIG. 4D shows an equivalent capacitor C in reference with FIG. 4B.

As shown in FIG. 4B, the layer 440 is added a connecting stripe 442 to connect the stripes therein at one end. Although not shown in the layer 430 (which is a grounding layer), these stripes in the layer 430 are in fact connected at one end as well. When both layers 430 and 440 on top of each other, a usable capacitor is formed without taking an additional silicon space. FIG. 4C shows an equivalent circuit of FIG. 4B and FIG. 4D shows the equivalent capacitor C.

Figure 5A:
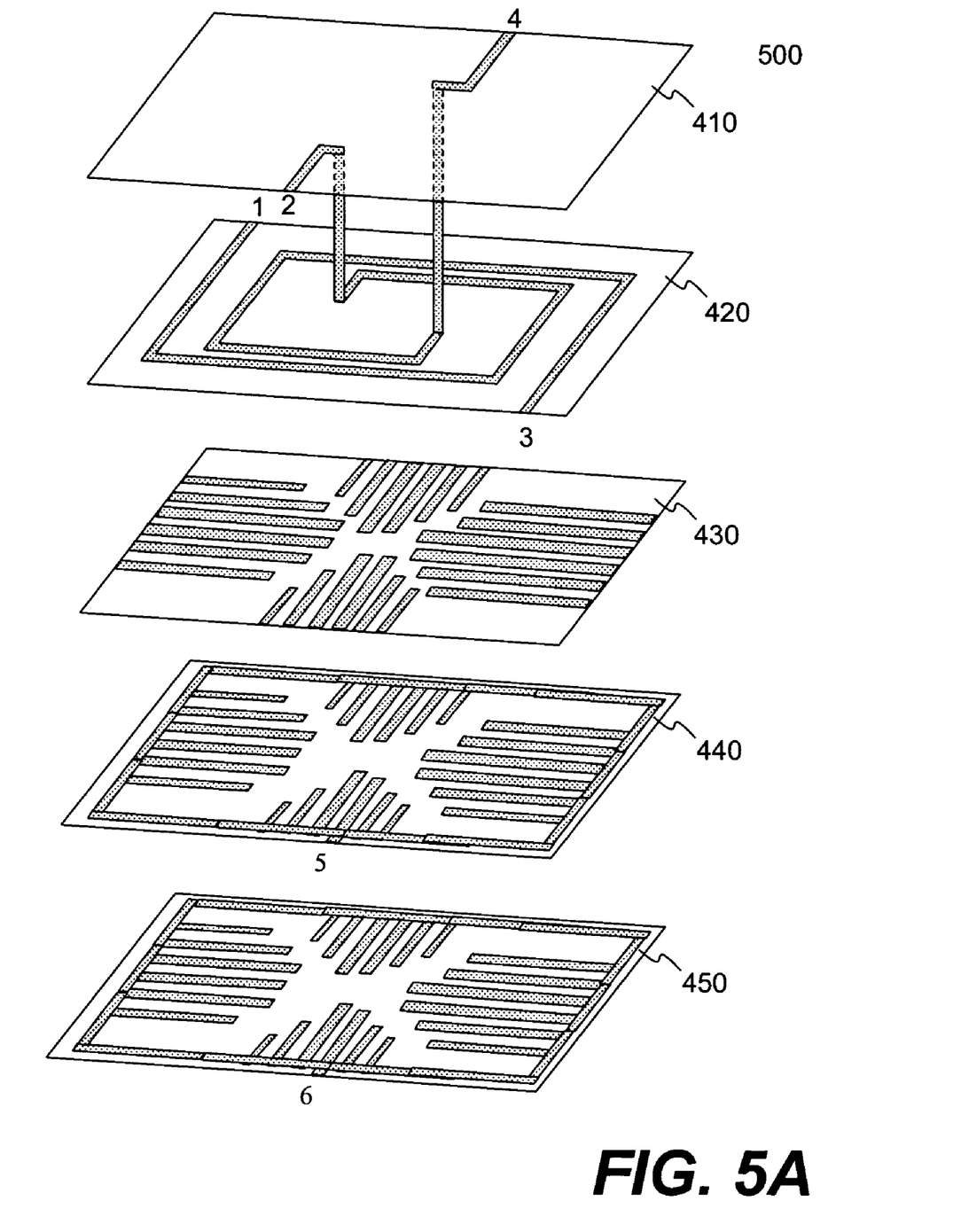
FIG. 5A shows another implementation in accordance with one embodiment of the present invention.

FIG. 5A shows another implementation in accordance with one embodiment of the present invention. In reference to FIG. 4B, one more layer 450 is added. The conducting stripes on the layer 450 are formed in a pattern substantially similar to that of the layer 430.

One possible configuration is referred to as a nongrounded capacitor. The capacitor in FIG. 4B, FIG. 4C or FIG. 4D has one terminal grounded and may be used in applications such as filtering. A capacitor formed in FIG. 5A does not have to have one terminal grounded as such the capacitor may be used in applications such as coupling. It can be appreciated by those skilled in the art that the capacitor in FIG. 5A can be readily used in the circuit of FIG. 1 or FIG. 3.

Figure 5B:
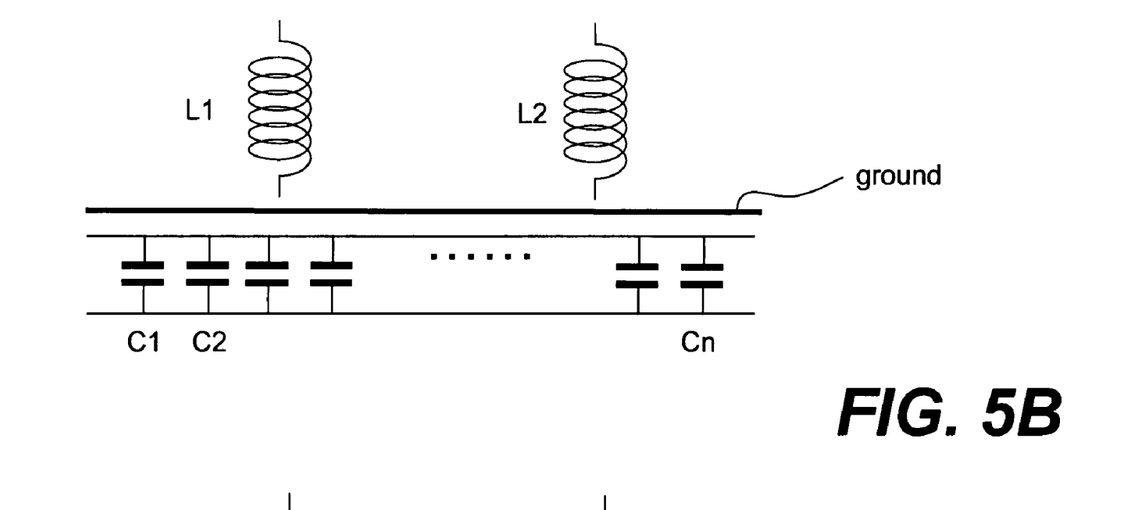
FIG. 5B shows an equivalent circuit of FIG. 5A.
Figure 5C:
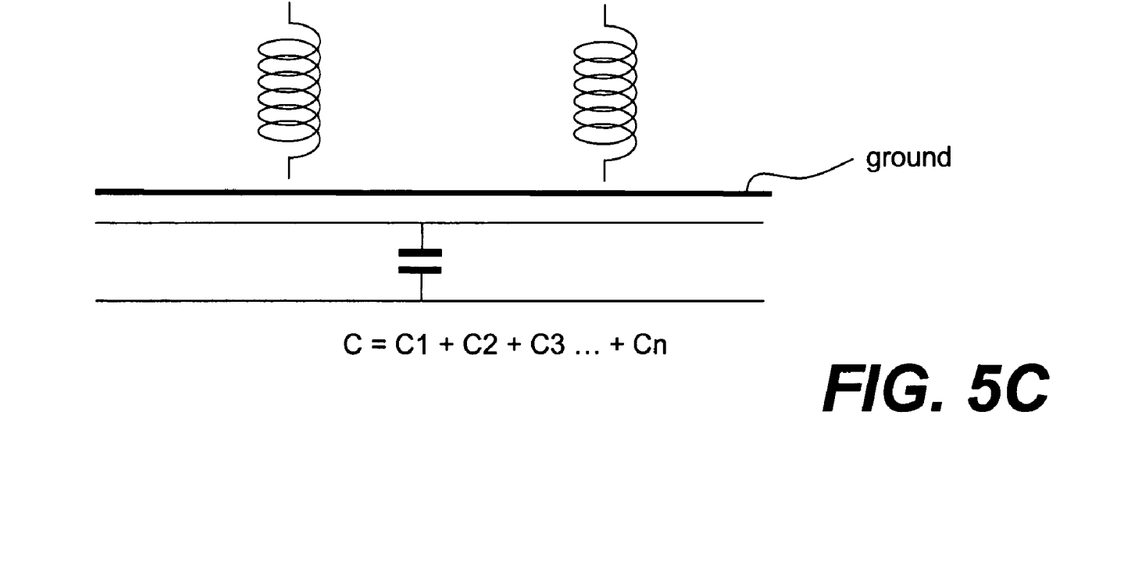
FIG. 5C shows an equivalent capacitor C in reference with FIG. 5A.

As none of the two terminals of a capacitor in accordance with one possible configuration is grounded, the usable capacitor is formed by placing the layers 440 and 450 on top of each other as such micro capacitors are formed by pairs of corresponding stripes on the layers. The parallel connection of these micro capacitors is achieved by connecting the stripes at one end as shown in FIG. 5A. FIG. 5B shows an equivalent circuit of FIG. 5A and FIG. 5C shows an equivalent distributed capacitor C.

Figure 6A:
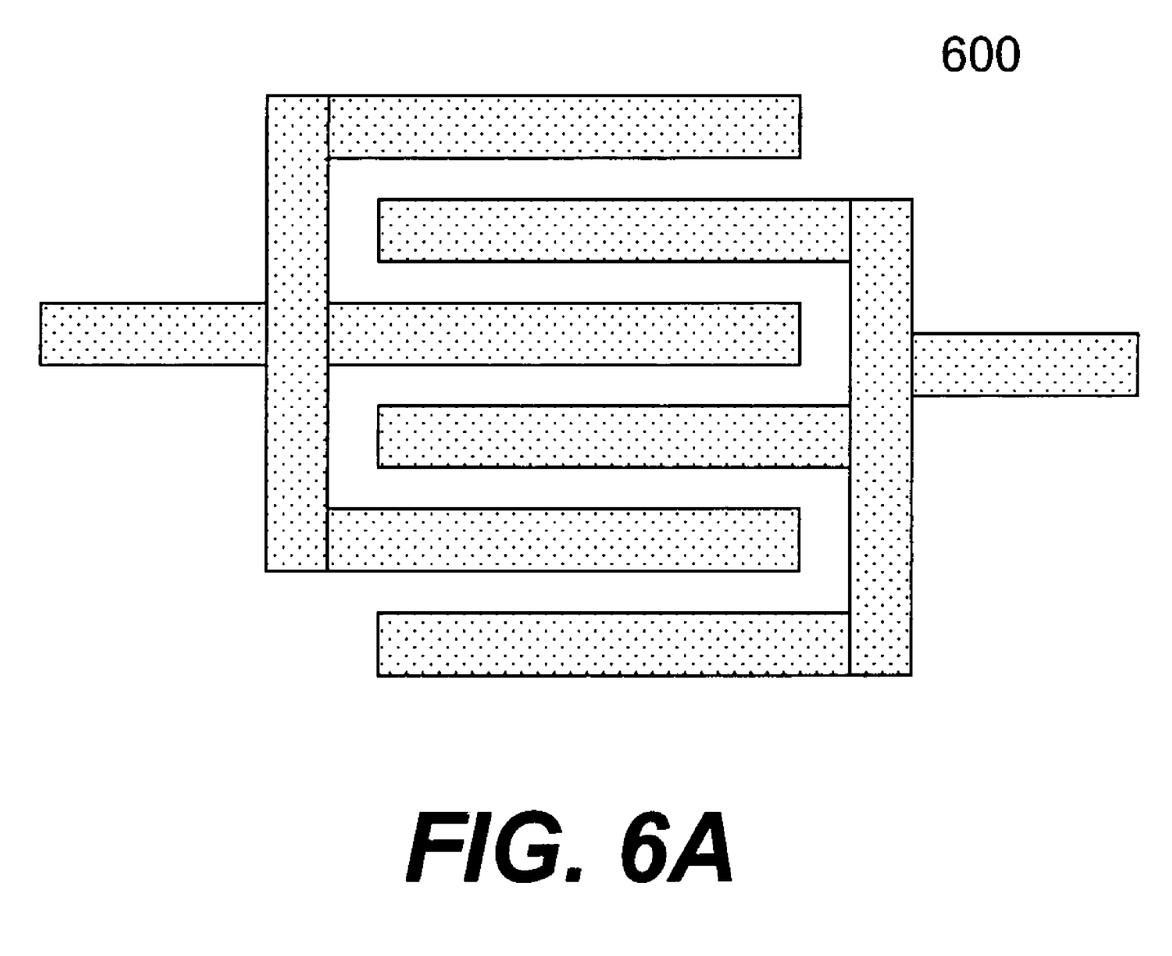
FIG. 6A shows an interdigitated capacitor that is implemented in prior art integrated circuits.

In certain circuits, one or more interdigitated capacitors are often used in conjunction with one or more inductive components. An interdigitated capacitor comprises several closely coupled parallel conducting stripes, and typically has a nominal value of about 0.1 pF below 1 GHz. As the frequency increases, the capacitor becomes more capacitive, due to the increase in fringing fields between the parallel conducting stripes. In the prior art, an interdigitated capacitor is implemented on a layer as shown in FIG. 6A, and it can be observed that such implementation would take a valuable silicon space when sizeable capacitance and inductance of an interdigitated capacitor are demanded.

Figure 6B:
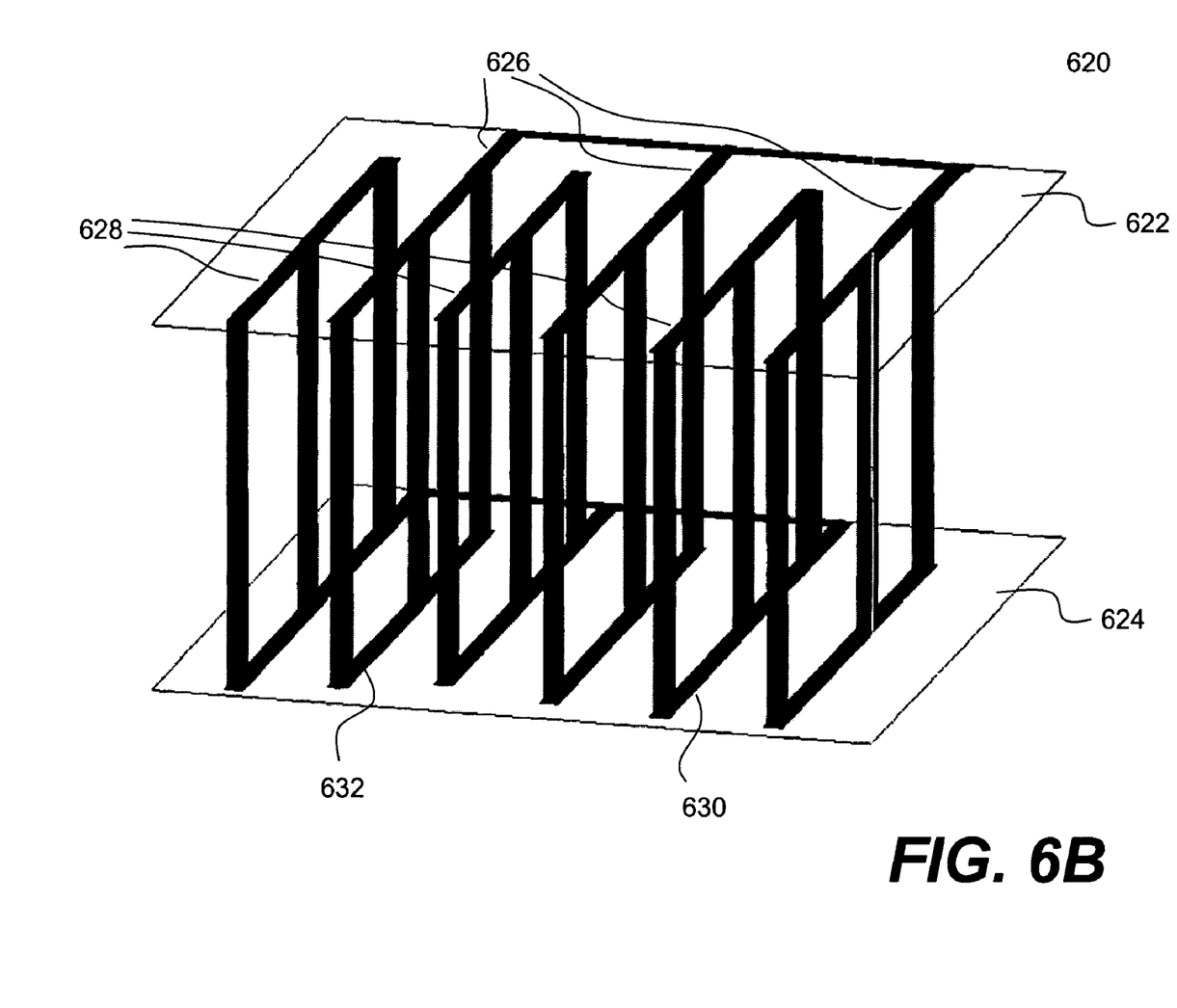
FIG. 6B shows an exemplary interdigitated capacitor according to one embodiment of the present invention in a three-dimensional perspective.

FIG. 6B shows an exemplary interdigitated capacitor 620 that is shown in a three dimensional perspective according to one embodiment of the present invention. The interdigitated capacitor 620 includes two plates on two layers 622 and 624, on each of the layers the individual conducting stripes are interlaced to form a set of micro interdigitated capacitors that are connected in parallel. As shown in FIG. 6B, an array of conducting stripes 626 and an array of conducting stripes 628 on the layer 622 are respectively interlaced and form a set of micro interdigitated capacitors. The same is applied to the layer 624 that also has a set of micro interdigitated capacitors. To increase capacitance and/or inductance of the micro interdigitated capacitors, the layers 622 and 624 are connected by conducting walls or stripes (e.g., VIAS). These micro interdigitated capacitors are then connected in parallel. As a result, an interdigitated capacitor with usable capacitance and perhaps usable inductance is formed.

Not to take an extra space on a silicon ship, the interdigitated capacitor, or the layers 622 and 624 are vertically disposed or implanted below or above an inductive component (e.g., one or more inductors or transformers). In reference to FIG. 5A, according to one embodiment, the layer 622 of FIG. 6B may correspond to the layer 440 of FIG. 5A while the layer 624 of FIG. 6B may correspond to the layer 442 of FIG. 5A.

Figure 6C:
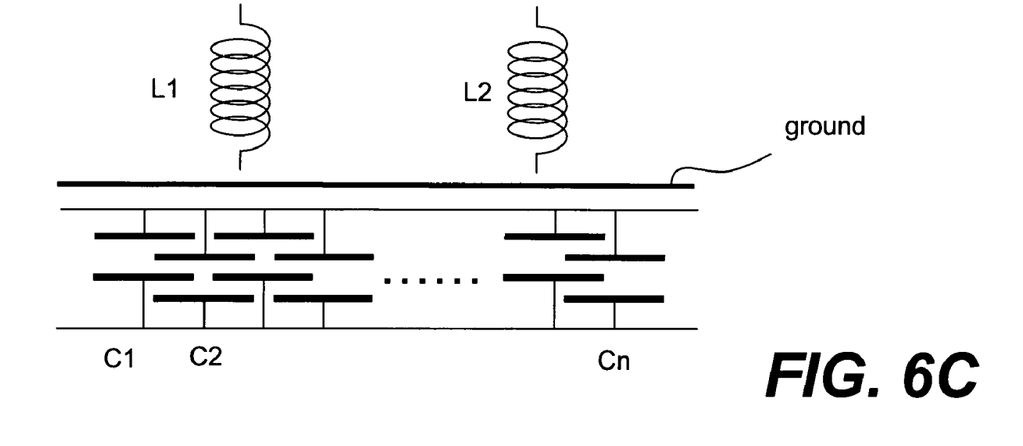
FIG. 6C shows an equivalent circuit of FIG. 6B used to form an interdigitated capacitor.
Figure 6D:
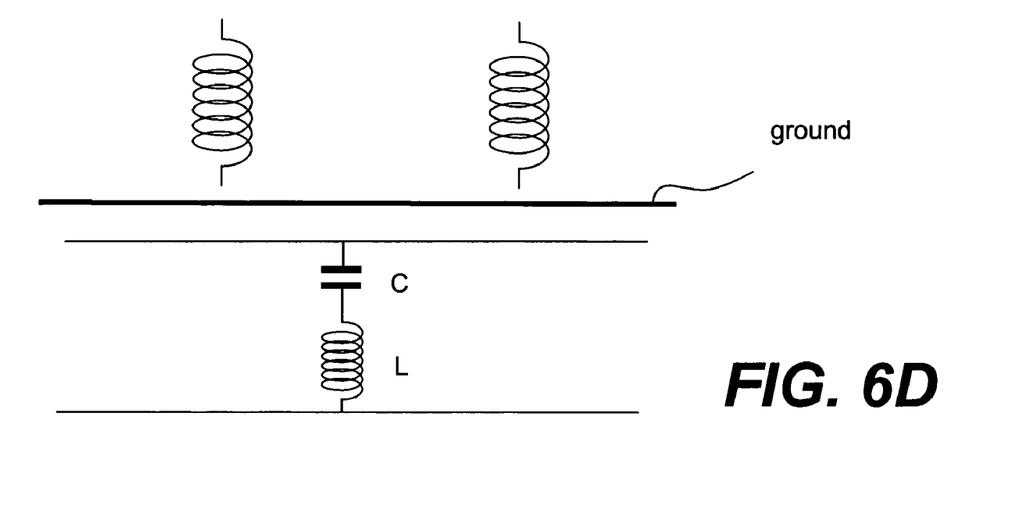
FIG. 6D shows the equivalent distributed circuit with a capacitor and an inductor, wherein the capacitor C is a capacitive accumulation of all the individual capacitors formed between the layers and the inductor L is an inductive accumulation of all the individual capacitors interlaced between the layers.

FIG. 6C shows an equivalent circuit of FIG. 6B used to form an interdigitated capacitor. It can be understood that two sets of micro interdigitated capacitors are interlaced, the interlaced effect of such arrangement depends on a signal frequency. FIG. 6D shows an equivalent distributed circuit with a capacitor and an inductor to represent the final interdigitated capacitor, wherein the capacitor C is a capacitive accumulation of all the individual capacitors formed between the layers and the inductor L is an inductive accumulation of all the individual capacitors interlaced between the layers. The exact expression of the capacitor and the inductor L is to be omitted to avoid obscuring aspects of the present invention.

Figure 7:
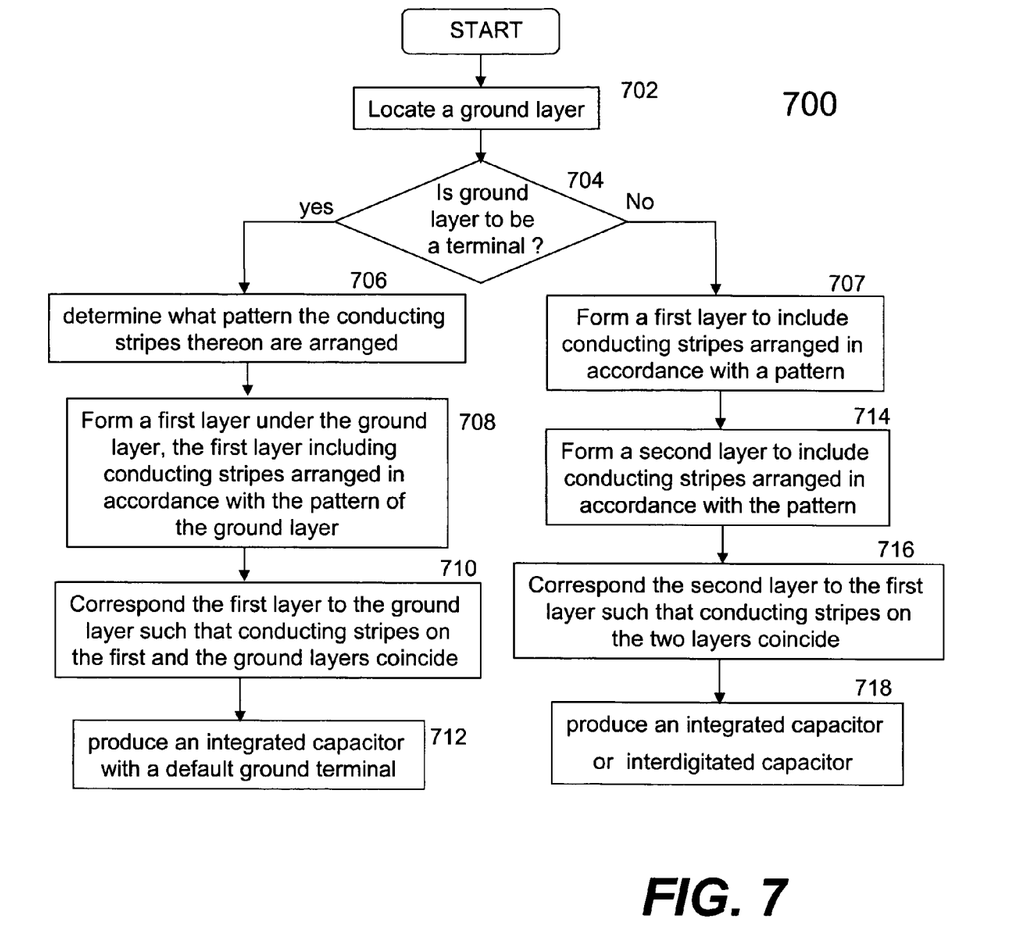
FIG. 7 shows a flowchart of forming an integrated capacitor or an interdigitated capacitor.

FIG. 7 shows a flowchart or a process 700 of forming an integrated capacitor or an interdigitated capacitor in accordance with one embodiment of the present invention. The process may be implemented as an apparatus or a method and applicable to various semiconductor processes or materials.

Typically, various components, such as transistors, resistors and inductors are implemented in a substrate supported by a ground layer. At 702, the ground is located. At 704, it is decided whether the ground layer is to be one of the two terminals in a capacitor. If one of the two terminals is to be grounded, the process goes from 704 to 706 to determine what pattern is used to arrange the conducting stripes on the ground layer. The ground pattern is a portion in a ground layer to support an inductive component (e.g., an inductor or a transformer) and is determined. As known in the art, the conducting stripes in a ground layer are formed in accordance with a pattern that facilitates to shield interference from the substrate and/or the inductive component. Typically, the pattern contains arrays of holes, gaps, or slots formed by the conducting stripes. The pattern is then used at 708 to arrange conducting stripes on a first layer. At 710, the first layer and the ground layer are positioned on top of each other such that the conducting stripes on the first and the ground layers coincide. As a result, a plurality of micro capacitors is formed. With proper connections, all the micro capacitors are connected in parallel.

At 712, an integrated capacitor is formed. If necessary, a dielectric layer may be inserted between the first layer and the ground layer to increase the capacitance of the integrated capacitor. Further it can be appreciated by those skilled in the art that two or more layers may be added to increase the capacitance.

Referring now back to 704, it is decided that none of the two terminals of the capacitor is to be grounded. Accordingly, the process 700 goes to 707. A first layer is formed at 707 to include conducting stripes arranged in accordance with a pattern. This pattern is preferably identical to that of the conducting stripes of the ground layer. At 714, a second layer is formed to include conducting stripes arranged in accordance with the pattern used in the first layer. At 716, both the first and second layers are positioned on top of each other. As the conducting stripes on the two layers are substantially identical and coincide, micro capacitors are respectively formed when the two layers coincide. At 718, an integrated capacitor is produced without occupying an extra space to increase the size of the silicon chip.

In one application, there is a need for an interdigitated capacitor. Thus at 707 and at 714, the patterns for each layer used to arrange the respective conducting stripes are identical. As shown in FIG. 6B, the pattern is to arrange the individual conducting stripes interlaced so as to form a set of micro interdigitated capacitors. At 716, both layers are on top of each other and connected by vertical conducting stripes. As a result, two sets of micro interdigitated capacitors on the two layers are connected in parallel. Thus at 718, an interdigitated capacitor can be created.

The present invention has been described in sufficient details with a certain degree of particularity. It is understood to those skilled in the art that the present disclosure of embodiments has been made by way of examples only and that numerous changes in the arrangement and combination of parts may be resorted without departing from the spirit and scope of the invention as claimed. For example, if desired, a dielectric layer may be inserted between two layers forming the micro capacitors or a dielectric material disposed between two conducting stripes. Also additional layers may be added to extend the array of conducting stripes to increase the number of micro capacitors. All layers may be placed vertically with respect to one or more inductive components (e.g., below, or above the inductive component, or partly below and partly above the inductive component). Accordingly, the scope of the present invention is defined by the appended claims rather than the foregoing description of embodiment.

We claim:

1. An integrated circuit including a capacitor integrated with at least an inductive component, the integrated circuit comprising:
    a substrate supporting an implementation of the inductive component;
    a ground layer, coupled to the substrate, having a plurality of conducting stripes arranged in accordance with a predetermined pattern to shield possible interference from the substrate and the inductive component; and
    a first layer including a plurality of conducting stripes arranged in accordance with the predetermined pattern, the first layer and the ground layer positioned on top of each other such that pairs of the conducting stripes on the first layer and the ground layer form a plurality of micro capacitors that are connected in parallel,
    wherein the capacitor is an accumulation of the micro capacitors and does not take an additional space that would otherwise increase a size of a silicon chip allocated for the integrated circuit.

2. The integrated circuit as recited in claim 1, wherein the capacitor is realized vertically with respect to the inductive component.

3. The integrated circuit as recited in claim 1, wherein the capacitor is realized right below or above the inductive component.

4. The integrated circuit as recited in claim 3, wherein the capacitor is coupled to the inductive component in a circuit.

5. An integrated circuit including a capacitor integrated with at least an inductive component, the integrated circuit comprising:
    a substrate supporting an implementation of the inductive component;
    a ground layer, coupled to the substrate, having a plurality of conducting stripes arranged in accordance with a first predetermined pattern to shield possible interference from the substrate and the inductor; and
    a first layer including a plurality of conducting stripes arranged in accordance with a second predetermined pattern; and
    a second layer including a plurality of conducting stripes arranged in accordance with the second predetermined pattern, wherein the first and second layers are positioned on top of each other such that pairs of the conducting stripes on the first and second layers form a plurality of micro capacitors that are connected in parallel,
    wherein the capacitor is an accumulation of the micro capacitors and does not take an additional space that would otherwise increase a size of a silicon chip allocated for the integrated circuit.

6. The integrated circuit as recited in claim 5, wherein the capacitor is realized vertically with respect to the inductive component.

7. The integrated circuit as recited in claim 5, wherein the first predetermined pattern is identical to the second predetermined pattern.

8. The integrated circuit as recited in claim 7, wherein the capacitor is coupled to the inductive component in a circuit.

9. An integrated circuit including a capacitor integrated with at least an inductive component, the integrated circuit comprising:
- a substrate supporting an implementation of the inductive component;
- a ground layer, coupled to the substrate, having a plurality of conducting stripes arranged in accordance with a predetermined pattern to shield possible interference from the substrate and the inductor; and
- a first layer including two groups of conducting stripes that are interlaced to form a set of micro interdigitated capacitors, the conducting stripes in each group being connected in parallel; and
- a second layer including two groups of conducting stripes that are interlaced to form a set of micro interdigitated capacitors, the conducting stripes in each group being connected in parallel, wherein the first and the second layers are positioned on top of each other and connected by arrays of conducting walls or stripes to form an interdigitated capacitor.

10. The integrated circuit as recited in claim 9, wherein the interdigitated capacitor is realized vertically with respect to the inductive component.

11. The integrated circuit as recited in claim 9, wherein the interdigitated capacitor is realized right below or above the inductive component.

12. The integrated circuit as recited in claim 11, wherein the interdigitated capacitor is coupled to the inductive component in a circuit.

13. The integrated circuit as recited in claim 9, wherein the interdigitated capacitor is realized above or below the inductor, the interdigitated capacitor and the inductive component being isolated by a ground layer.

14. The integrated circuit as recited in claim 9, wherein the interdigitated capacitor is an accumulation of the first and second sets of the micro capacitors and does not take an additional space that would otherwise increase a size of a silicon chip allocated for the integrated circuit.

15. The integrated circuit as recited in claim 9, wherein the interdigitated capacitor demonstrates a capacitive component and an inductive component, both varying with a frequency of a signal acting thereon.

16. The integrated circuit as recited in claim 9, wherein the conducting stripes on the first layer and the second layer are both arranged in accordance with the predetermined pattern for the ground layer.

17. A method for designing an integrated circuit including a capacitor integrated with at least an inductive component, the method comprising:
- locating a ground layer;
- determining a pattern according to which conducting stripes are formed on the ground layer to isolate the inductive component above a substrate;
- implanting conducting stripes in a first layer on top of each other with the ground layer, the conducting stripes arranged in accordance with the pattern;
- when the ground layer is to be used as one of two terminals of the capacitor,
  - forming a plurality of micro capacitors between pairs of the conducting stripes on the ground layer and the first layer; and
  - connecting the micro capacitors in parallel to form the capacitor;
- when the ground layer is not to be used as one of two terminals of the capacitor,
  - implanting conducting stripes in a second layer on top of each other with the first layer, the conducting stripes arranged in accordance with the pattern;
  - forming a plurality of micro capacitors between pairs of the conducting stripes on the first layer and the second layer; and
  - connecting the micro capacitors in parallel to form the capacitor.

18. The method of claim 17, when the ground layer is not to be used as one of two terminals of the capacitor, wherein the pattern causes the conducting stripes on the first layer as well as the second layer to be interlaced respectively such that the micro capacitors are micro interdigitated capacitors, and as a result, the capacitor is an integrated interdigitated capacitor of the micro interdigitated capacitors.

19. The method of claim 17, wherein the conducting stripes on the first layer and the second layer are respectively connected with arrays of conducting strips and conducting walls.

* * * * *